United States Patent [19]

Rich et al.

[11] Patent Number: 5,063,293

[45] Date of Patent: Nov. 5, 1991

[54] POSITRON MICROSCOPY

[75] Inventors: Arthur Rich; James C. Van House, both of Ann Arbor, Mich.

[73] Assignee: The University of Michigan, Ann Arbor, Mich.

[21] Appl. No.: 618,521

[22] Filed: Nov. 23, 1990

Related U.S. Application Data

[60] Continuation of Ser. No. 359,951, Jun. 1, 1989, abandoned, which is a division of Ser. No. 118,550, Nov. 9, 1987, Pat. No. 4,864,131.

[51] Int. Cl.⁵ .................................................. H01J 37/26
[52] U.S. Cl. .................................. 250/308; 250/306; 250/307; 250/309
[58] Field of Search ............... 250/308, 309, 306, 307; 376/413, 156

[56] References Cited

U.S. PATENT DOCUMENTS

| | | | |
|---|---|---|---|
| 2,928,943 | 3/1960 | Bartz et al. ........................... | 250/310 |
| 3,885,157 | 5/1975 | Heinemann ........................... | 250/311 |
| 4,740,694 | 4/1988 | Nishimura et al. ................... | 250/306 |
| 4,864,131 | 9/1989 | Rich et al. ........................... | 250/308 |

OTHER PUBLICATIONS

Zitzewitz et al., Physical Review Letters, vol. 43, No. 18, Oct. 29, 1979, pp. 1281-1284.

Primary Examiner—Jack I. Berman
Attorney, Agent, or Firm—Raphael A. Monsanto; Benita J. Rohm

[57] ABSTRACT

A positron microscope system utilizing image enhancement to overcome problems associated with low positron source flux can be operated in transmission and reflection modes. In the practice of the invention, slow positrons which are emitted after moderation of a positron source are focused, as a source beam, on a specimen target. In some embodiments, the source beam is swept over the specimen target, to effect scanning thereof. Image enhancement is effected by a channel electron multiplier array (CEMA) which may have a plurality of plates. The cloud of electrons which is generated by the CEMA in response to each incident positron is accelerated toward a long persistence phosphor screen. Image acquisition is achieved by a low light video system which delivers its signal to a memory which stores the data. The data is subsequently subjected to an image analysis algorithm which facilitates accumulation and signal averaging. In one system according to the invention, secondary electrons generated in response to incidence of positrons on a specimen target are imaged, and such imaging may employ information obtained from detection of gamma rays.

10 Claims, 7 Drawing Sheets

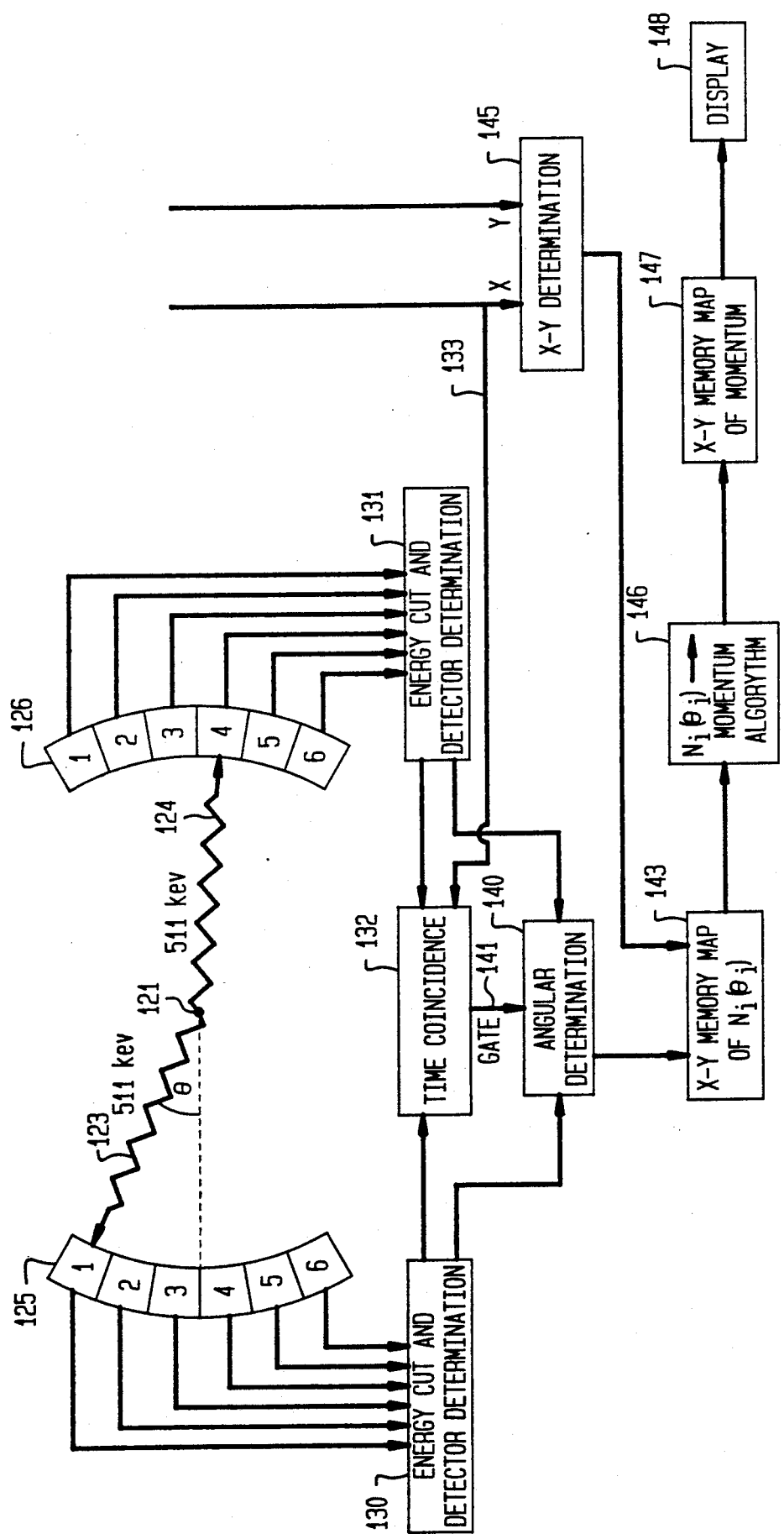

POSITRON MICROSCOPY

RELATIONSHIP TO OTHER APPLICATIONS

This application is a continuation of Ser. No. 07/359,951, filed June 1, 1989 now abandoned, which is a division of Ser. No. 05/118,550 which was filed on Nov. 9, 1987 and was issued on Sept. 5, 1989 as U.S. Pat. No. 4,864,131.

BACKGROUND OF THE INVENTION

This invention relates generally to microscope systems of the type which employ subatomic particles in the imaging process, and more particularly, to transmission and re-emission positron ($e^+$) microscope systems wherein low energy, or slow, positron beams are employed.

Notwithstanding that during the past ten years it has become possible as a result of advances in technology to produce low energy (on the order of 1 eV) positron beams from an initially high energy positron source, typically with an intensity on the order of $10^7$ $e^+$/sec., generally believed by persons skilled in this art that the development of an effective positron microscope system is not feasible at the present due to the low intensity and current density of available positron beams. This is entirely contradistinct from the ease with which electron ($e^-$) beams are generated having sufficiently high flux to permit production of images visible to the eye. Such $e^-$ beams, which are easily produced, illustratively from a heated tungsten filament, are high quality and have magnitudes of current on the order of tens of microampers ($10^{15}$ $e^-$/sec.).

In addition to having low current densities, current slow positron beams are reduced in their output flux by a factor of at least $10^3$ during improvement of beam quality to meet the requirements necessary to produce a good image. This factor results from the following:

1. Between the source and the sample being investigated a set of electron focussing lenses are required so as to produce a highly parallel beam which is extremely small. Such focussing results in a diminution in beam intensity by a factor of 10.

2. After the beam interacts with the target, a further set of electron lenses selects a very narrow angular cone of the emitted beam so as to produce a high contrast, high resolution image. Such angular selection results in an additional factor of $10^2$ loss in rate.

3. Finally, the beam is magnified and protected onto a detector. As a result of the limits on the size of the detector, this magnification (M) process can result in further losses which increase as a function of $M^2$. It is therefore evident, that for the electron source, approximately $10^{12}$ $e-$/sec. can be utilized in image formation while in a positron environment, at best, only $10^4$ $e+/$-sec. are available.

Under the best possible conditions, the human eye can detect an image produced by beam current densities as low as $10^8$ $e-/cm^2$- sec. incident on a phosphor screen. With the use of currently available image intensifiers, plus computer-based signal averaging, it is possible to detect images at densities as low, or lower, than $10^6$ $e-/cm^2$-sec. Under the lowest possible useful microscope magnification, the positron beam discussed above will have a current density of $10^5$ $e+/cm^2$-sec. This is approximately one order of magnitude below what is normally used in high resolution, low dose, electron microscopy, and is one of the primary reasons why positron microscopy has not been considered to be feasible.

The significance of a positron microscope system in the art is made evident from an understanding of the manner in which positrons interact with matter. When positrons are injected into matter, a number of interactions occur between the injected particle and the medium into which it is injected. A positron may undergo one or more scatterings, it may be backscattered out of the medium, or it may cause ejection of a secondary electron. If the medium is sufficiently thin, and if the positron has sufficient energy, it may be transmitted right through the medium.

In the transmission mode of operation, no significant new physics is expected to occur at low magnifications in the operation of a transmission positron microscope. This is because the fundamental interactions responsible for removing positrons from a transmission positron microscope beam are essentially identical to those for removing electrons from a transmission electron microscope beam. On the other hand, diffraction patterns obtained from thin samples could be studied in a manner analogous to diffraction studies using transmission electron microscopes. Such diffraction patterns will be different from corresponding electron diffraction patterns, particularly at energies below 10 keV.

It should also be possible to exploit the fact that the positron beam of the present invention is spin polarized with polarizations as high as P=0.7 being possible, albeit at a factor of 5 decrease in beam intensity. This should make it possible to perform Polarized Low Energy Positron Diffraction (PLEPD) in the transmission mode. The ensemble of high energy positrons emitted from the nuclear beta decay of the radioactive isotopes most commonly used to produce slow positron beams are naturally spin polarized as a consequence of the weak interaction that created them. The spin polarization of the high energy positrons is retained during their slowing down in the slow positron moderator. As a consequence, the slow positrons emitted from the moderator are also spin polarized. Acceleration and focusing of the slow positrons allows the formation of a spin polarized beam. The degree of spin polarization of the slow positron beam can be controlled by placing absorbers of a low atomic number between the source of high energy positrons and the moderator. The absorber acts on the principle that the lower energy part of the radioactive source spectrum (initially some tens of keV), which, as a consequence of the weak interaction, has a lower degree of spin polarization, stops in the absorber, rather than the moderator. Only the higher spin polarized, initially high energy positron of the source spectrum passes through the absorber to the moderator, and therefore the resultant slow positrons produced by the moderator have a higher degree of spin polarization. The direction of spin polarization of the resultant positron beam can be controlled by the suitable application of crossed electrostatic and magnetic fields. Polarized positron microscopy, as a complement to the recently developed polarized electron microscope, should yield information on the exchange interaction and other spin-polarized phenomena.

Although the foregoing interactions occur for both, positrons and electrons, the fact that positrons are antimatter cause them to have certain characteristics which cause them to undergo types of interactions which are not shared by electrons. For example, a positron may combine with an electron, resulting in annihilation of the particles and emission of two gamma-rays in substantially opposite directions, each having an energy ($E=mc^2$) of approximately 511,000 eV. Alternatively, a positron may capture an electron to form the hydrogenlike positron-electron bound state called positronium (Ps). The Ps atom may annihilate in the medium into two or three gamma rays after a characteristic Ps lifetime, typically on the order of 1 to 3 nanoseconds, depending on the medium. Alternatively, the Ps may escape from the medium and live in a vacuum with a 140 nanosecond lifetime. In addition to the foregoing, the positron might stop in the medium and travel slowly (diffuse) to the surface where it can be ejected from the medium by electric fields which exist at most surfaces in a vacuum. This surface electric field, which is also known as the work function, typically pulls electrons back into the medium, but can operate to repel positrons out of the medium.

The phenomenon of expelling slow positrons from the medium is known as "slow positron emission," and forms the basis of production of slow positron beams. In certain regards, this phenomenon is similar to the process of electron field emission.

In addition to the foregoing, the positron injected into a medium may be trapped in a defect, which is the absence of a positively charged atom. The positron will live in the defect for a lifetime which is to an extent determined by the size, charge, and other properties of the defect, after which the positron is annihilated. Thus, a positron microscope system can be expected to produce images resulting from at least the four phenomena: annihilation, positronium formation, slow positron emission, and defect trapping, such images not being achievable with electron microscopy.

The foregoing notwithstanding, there do exist significant similarities between electrons and positrons, and in the manners in which microscopy employing these particles can be conducted. Referring for the moment to electron microscope systems, the electron microscope can take different forms, illustratively the transmission electron microscope (TEM) and the reflection electron microscope (REM). In both such types, a scanning process may be applied to achieve imaging of relatively large areas at high magnification.

The TEM operates by transmitting a high energy (20 keV to 1 MeV) electron beam having a small diameter on the order of $10^{-5}$ meter through a thin slice of the material to be studied. During transmission of the beam through the sample, different parts of the beam are strongly scattered out of the beam, or blocked. The degree of scattering is dependent on variations in the composition of the target. After transmission, the initially uniformly distributed beam is characterized by regions of low intensity where the sample has preferentially eliminated electrons from the beam, and regions of high intensity where the sample and beam had little interaction. Thus, an image of the sample is contained in the information in the intensity distribution in the beam. The relative difference in intensity between the regions of high and low intensity is called the contrast of the image. At this point, just after transmission through the sample, the beam and its image information are still contained in the original $10^{-5}$ meter beam diameter, and the image size is identical to the size of the different features in the sample which produced the regions of high and low intensity. This narrow beam propagates to the vicinity of a series of powerful electron lenses, which are usually magnetic fields, and which are applied to increase the beam diameter from $10^{-5}$ meters up to several meters in diameter without distortion of the image information contained in the beam. This can result in a magnification factor of up to $10^6$. A large fraction of the outer edge of the beam is therefore lost in the magnification process. The magnified high energy electron beam is then allowed to strike a phosphor screen where the electron kinetic energy is converted into light, producing an optical image, with regions of high intensity corresponding to the absence of a given feature. At this point, a feature of 1 Å diameter ($10^{-8}$ cm) in the sample will appear on the phosphor screen as a dark area of 0.1 mm in diameter, a size which can be seen by the human eye.

The ability to distinguish small features on the image is called the "resolution" of the electron microscope. For the 1 Å feature discussed above, the resolving power of the microscope is 1 Å. In principle, features of any size can be resolved from each other with high enough magnification and beam current density. In practice, however, quantum mechanical effects limit the resolving power of the electron microscope to distinguishing features of about 1 Å from each other.

Another phenomenon which appears in the TEM is diffraction. This effect is primarily quantum mechanical in nature and arises from the wave nature of the particles involved. In certain regards, the diffraction effect is qualitatively similar to the wave patterns produced when two waves intersect on a pond. The wave pattern of the incident electron will interact with the different wave patterns of electrons in the sample in a way which produces highly regular patterns of high transmission and low transmission. Each different type of molecule has its own unique diffraction pattern which identifies it like a fingerprint. Thus, the diffraction patterns can be used to identify the composition of a given sample. The diffraction patterns are also sensitive to changes in the chemical binding of one molecule to another, to the orientation of any crystal planes which may be in the sample, and to some types of defects in the sample.

The Reflection Electron Microscope (REM) has magnifying optics as does the TEM, but these optics magnify images resulting from electrons which scatter backwards from the initial beam direction. These electrons are produced primarily from two processes, and include: (1) elastically backscattered electrons which retain their high energy, and (2) secondary electrons which are emitted with about 30 volts of energy. As a result of their low energy, detection techniques which are different from those used in TEM are frequently used to form an image from the secondary electrons.

The images formed from the two types of electrons emitted will highlight different features of the sample, because the basic interactions involved in their production are different. Backscattered electrons are produced primarily form the nuclei of the atoms, whereas secondary electrons are produced by interactions with the electrons in the medium. Thus, complementary features can be compared directly.

The basic advantage of the reflection mode of electron microscopy is that it obviates the need to make thin slices of the sample to form an image. A wider range of targets, including targets which would be destroyed by slicing, can be studied using the REM. Such targets include, for example, integrated circuit chips.

The formation of images from secondary electrons becomes particularly powerful when combined with a scanning technique. No essential difference should exist between the deflection plate design of a scanning electron microscope, and that of a scanning positron microscope. In both cases, the deflection plates would consist of two independent parallel pairs rotated at 90° with respect to one another. One pair controls the x position of the beam, and the other pair controls the position of the beam. The x,y position of the beam is controlled by application of varying electric fields to the pairs of the plates. The plates are located as the last element in the electron optical system prior to the beam hitting the target.

In this mode of operation an extremely small beam, having a size typically on the order of $10^{-8}$ meters in diameter, is swept along the surface of the target by means of electric deflection plates. The secondary electron current is detected as the beam sweeps the target and an image is formed from the variation in current as a function of position. Using the scanning technique allows the use of low energy electron beams (less than 1000 volts), which reduces the amount of damage to the sample, and also reduces the time required to examine each specimen.

It is, therefore, an object of this invention to provide a positron microscope system.

It is another object of this invention to provide a positron microscope system which utilizes slow positron beams.

It is also an object of this invention to provide a positron microscope system which employs a positron moderation technique to enhance the brightness of a source of high energy positron emission.

It is a further object of this invention to provide a positron microscope system which employs computerized image analysis techniques.

It is additionally an object of this invention to provide a positron microscope system wherein imaging can be achieved in a backscattering, or reflection, mode of operation.

It is yet a further object of this invention to provide a positron microscope system wherein imaging can be achieved in a transmission mode of operation.

It is also another object of this invention to provide a positron microscope system which can use an electron optical lens system.

It is yet an additional object of this invention to provide a modified electron optical lens system for use with a moderated positron beam.

It is still another object of this invention to provide a positron microscope system wherein imaging can be achieved using low beam current densities.

It is a yet further object of this invention to provide a system for multiplying current density for producing an image visible to the eye.

It is also a further object of this invention to provide a positron microscope system which utilizes the phenomenon of slow positron re-emission to produce an image.

It is additionally another object of this invention to provide a positron microscope system which utilizes the phenomenon of positron annihilation to produce an image.

A further object of this invention is to provide a positron microscope system which utilizes the phenomenon of positronium formation to produce an image.

An additional object of this invention is to provide a positron microscope system which utilizes the phenomenon of defect trapping to produce an image.

Yet another object of this invention is to provide a system for accelerating slow positrons, having high contrast and resolution.

Another object of this invention is to provide a positron microscope system which can produce a spatial image.

A yet further object of this invention is to provide a system which can be used to study electron momentum and distribution of electron momenta.

It is also an additional object o this invention to provide a system which can be used to generate a spatial image corresponding to the distribution of electron momenta.

A still further object of the invention is to provide a positron microscope system which utilizes positronium atoms to generate an image.

An additional object of the invention is to provide a positron microscope system which utilizes gamma rays resulting from positron annihilation to generate an image.

Yet another object of the invention is to provide a system which utilizes spin polarized positrons to facilitate diffraction studies.

Also, it is an object of this invention to provide a positron microscope system which can generate correlated images using transmission and reflection modes of operation simultaneously.

Still another object of this invention is to use spin polarized positrons to generate images.

SUMMARY OF THE INVENTION

The foregoing and other objects are achieved by this invention which provides a positron microscope system for producing magnified images of a specimen target. In accordance with one aspect of the invention, the novel positron microscope system is provided with a slow positron source for producing a source beam formed of low energy positrons. A focusing arrangement is provided for focusing the source beam and directing the low energy positrons of the source beam onto the specimen target. Additionally, a single particle image enhancement arrangement produces an image responsive to a target beam formed of ones of the low energy positrons of the source beam which, in this embodiment, pass through to the other side of the specimen target.

The type of microscopy contemplated by slow positron transmission could be used to illuminate a thin, extremely uniform single crystal sample as the specimen target. On the other side of the specimen target slow positrons are produced and emitted in a narrow conical configuration. A microscopic specimen, such as a virus, can be placed on the crystal to block, or reduce, slow positron emission. The virus therefore appears as a dark region in the resulting image corresponding to the slow positron flux. It is a significant advantage of using slow positrons to perform imaging that they are characterized by a relatively narrow energy spread, as compared to electrons. This results in images having higher contrast and resolution.

In one embodiment of the invention, an objective lens and then a projector lens focuses the target beam onto the single particle image enhancement arrangement which includes a target plate for receiving the target beam. The target plate emits a multiplicity of electrons in response to each positron in the target beam striking the target plate. Additionally, a display plate supports a phosphor layer in a substantially planar configuration and substantially parallel to the target plate. The phosphor of the phosphor layer interacts with the multiplicity of electrons emitted by the target plate to produce a multiplicity of photons corresponding to each such electron.

In accordance with a significant aspect of the present invention, the source of slow positrons includes a positron moderator for producing the low energy positrons. The positron moderator includes a thermalizing system for receiving high energy positrons and producing responsively the source beam, which, as previously noted, is formed of slow positrons.

In a specific illustrative embodiment of the invention, the thermalizing system is formed of tungsten (W), and cooperates with a source of high energy positrons. The source of high energy positrons is installed, in this embodiment, on a window arranged intermediate of the source of high energy positrons and the thermalizing system. In a practical embodiment of the invention, the source of high energy positrons may be formed of $^{22}$Na, and the window can be formed of Ti. Thus, the high energy positrons emitted by the source of high energy positrons propagate through the window means and communicate with the thermalizing system, which may be configured as a plurality of vanes arranged substantially parallel to the direction of travel of the source beam.

In a further embodiment of the positron microscope system there is additionally provided a source beam bending arrangement for bending the source beam. There is not a need for the positron microscope system to be arranged entirely on a straight axis. In fact, it is advantageous to bend the beam out of the path of stray radiation emitted by the high energy source used to generate the source beam. An objective lens is used to focus the target beam, and a contrast aperture controls an aperture dimension of the target beam.

In a transmission positron microscope embodiment of the invention, the slow positron source and the brightness level enhancement arrangement are on opposite sides of the specimen target from one another. Thus, the image is formed of positrons which are transmitted through the specimen target. Additionally in such an embodiment, there may additionally be provided a further single particle image enhancement system arranged to receive secondary electrons which are returned from the specimen target in a direction substantially toward the slow positron source. The further single particle image enhancement system permits simultaneous imaging of reflection microscopy, thereby facilitating the imaging and comparison of complementary features.

In a reflection positron microscope system embodiment of the invention, the slow positron source produces the source beam which, as noted hereinabove, is formed of low energy positrons. There is further provided a focusing arrangement for focusing the source beam and directing the low energy positrons of the source beam onto the specimen target. In this embodiment of the invention, however, the single particle image enhancement produces an image responsive to a re-emission beam formed of low energy positrons which are re-emitted by the specimen target substantially in a direction toward the slow positron source.

Re-emitted slow positrons are highly advantageous from the standpoint of imaging since they are extremely sensitive to the nature of the surface of the specimen target. The surface of a specimen target is usually considered to be about the first few atomic layers deep, typically 1 to 2 ($10^{-8}$ cm). This phenomenon is to be contrasted with the known process of imaging photoelectrons, in photoelectron emission microscopy, which are produced by the primary particle at depths of several tens$\times 10^{-8}$ cm. Photoelectrons are therefore less sensitive to surface characteristics as they emerge from a specimen target. The surface sensitivity of re-emitted slow positrons can lead, for example, to new insights into thin film phenomena, such as cell walls in biology, dielectric interfaces, etc. In addition, slow positron emission would also be sensitive to the presence of defects at the surface of the specimen target by permitting at least one positron to become trapped in the defect, where it would annihilate. Such trapping of a positron in a defect would appear as a dark spot (absence of the annihilated slow positron) on an image, and would be useful, for example, in the scanning of integrated circuit chips. An objective lens focuses the reemission beam, and an accelerator, which is arranged intermediate of the target specimen and the objective lens, accelerates the positrons in the re-emission beam.

The single particle image enhancement arrangement used in the practice of the invention for enhancing the brightness of an indication responsive to an incident particle, includes a target plate for receiving the incident particle. The target plate emits a multiplicity of electrons in response to the incident particle. These electrons are then accelerated toward a phosphor which is employed to interact with the multiplicity of electrons emitted by the target plate in a manner which results in the responsive emission of light. There is additionally provided a display plate for supporting the phosphor in a substantially planar configuration and substantially parallel with the target plate.

As indicated, an accelerator is provided in the single particle image enhancement arrangement for accelerating the multiplicity of electrons emitted by the target plate in a direction toward the display plate. In a specific embodiment, the accelerator has associated therewith a power supply coupled to the display plate for applying thereto a voltage having a predetermined amplitude and polarity for attracting the multiplicity of electrons toward the display plate, whereby at least some of the multiplicity of emitted electrons communicate with the phosphor.

In a further embodiment of the invention, there is additionally provided a memory, which may be a computer memory, for storing an image produced in the vicinity of the display plate in response to interaction between the multiplicity of emitted electrons and the phosphor. An image analysis system, which analyzes the data stored in the memory, operates on the data stored in the memory. Image acquisition may be achieved by a video system, in certain embodiments of the invention. Such image acquisition would be required in those embodiments of the invention where the current density at the display plate is too low for direct viewing of the image.

In accordance with an electron multiplier aspect of the invention, a system for enhancing images utilizes a two-plate channel electron multiplier array (CEMA), as well as associated image storage and analysis electronic systems. The CEMA system, in certain embodiments, will permit imaging at current densities as low as 10 $e^-/cm^2$-sec. The CEMA generates a cloud of approximately $10^8$ electrons for each individual particle which hits it. This electron cloud, when accelerated onto a phosphor screen multiplies the light output of a single particle by approximately $10^6$, thereby enabling visual detection of each single particle.

In practice, a channel electron multiplier array is a thin (0.8 mm) piece of leaded glass having approximately $10^6$ channels of 10 $\mu$m diameter running through the thickness. Each channel has an 80:1 length-to-diameter aspect ratio. The open area of the sheet is 50% open, i.e., the channels occupy 50% of the surface area of the sheet. The leaded glass is heat treated in a reducing atmosphere to give the surface of the channel a secondary electron emission probability greater than 1, allowing the possibility of electron multiplication. This multiplication occurs after the application of an electric field between the front and back surfaces. When a charged particle strikes one surface, it will emit a secondary electron which will be attracted by the electric field down the channel until it arrives at a surface, where it emits perhaps two more electrons. These secondary electrons are further accelerated until they hit another surface, thereby each emitting two further electrons. This process continues until about $5 \times 10^3$ electrons emerge from the back side of the channel electron multiplier array for each incident charged particle. If two plates are placed against one another, approximately $3 \times 10^7$ electrons will emerge from the back end of the two-plate configuration. When three plates are used together, the gain is about $1 \times 10^8$. This is the ultimate limit on the gain due to space saturation in the channel. This type of system operates equally well in an environment where positrons are the incident particles.

A low light level video camera system is arranged to receive the image produced by the CEMA system. Such a video camera may be a DAGE MTI 65K low light video camera. The output of the video camera is conducted to a digitizer board, illustratively one sold by Chorus Data Systems, which converts the analog camera signal into a binary digital form, i.e., 0=no event, 1=event. The digitized information is analyzed, by a signal averaging system which permits the image to be built from the individual flashes, and added to an appropriate memory location of a high resolution ($512 \times 512$ pixel) graphics board, such as one available commercially from the Number Nine Corporation. In certain embodiments of the invention, such averaging may occur over a period of 48 hours. The resulting information is displayed on a high resolution monitor, which may be an Apple IIE monitor. The host computer for the digitizer board and the graphics board may be an IBM PC. Additionally, the video signal from the camera may be stored in a conventional video cassette recorder system.

Scanning of the positron source beam across the specimen target is effected with the use of electrostatic deflection plates. Such scanning provides the advantage that, in certain embodiments of the invention where the source beam is very narrow, the target beam need only carry amplitude information. The resulting spot of light on the phosphor screen therefore can be stored as a magnitude value in a memory, where image accumulation is achieved.

In accordance with still a further aspect of the present invention, the positron microscope system can be applied to study electron momentum distribution. It is known that when a positron annihilates with an electron, two gamma rays are produced. As a result of the principle of conservation of momentum, the gamma rays are emitted exactly 180° apart. However, electrons in a medium posses a small amount of momentum, and therefore the angle between the gamma rays is shifted slightly. The shift is required to achieve conservation of momentum, and corresponds approximately to $P_e/mc$, where $P_e$ is the electron momentum and m and c are the mass of the electron and the speed of light, respectively. The electron momentum varies in the target specimen as a function of material composition, crystal structure, and many other factors, and such variation will be indicated by the angular distribution of the annihilation gamma rays.

More specifically, when positrons slow down to kT thermalize) in matter, several different phenomena occur. They may diffuse $10^{-8}$ to $10^{-7}$ meters to a surface where they may be expelled out of the material by the surface work function, if it is negative, as a re-emitted slow position. Thermalization is the process a high energy positron emitted from a radioactive source undergoes when it enters a moderator. The positron's initial energy is lost, after entering the moderator material, through a series of inelastic, nonconservative collisions with the particles in the moderator until its energy reaches thermal equilibrium at, or near 1/40 eV. In this context, thermal equilibrium means that the motion of an ensemble of positrons is random in direction. This phenomenon forms the basis of the positron re-emission microscope, also discussed herein.

The positrons may also combine with an electron within a diffusion length ($10^{-8}$ to $10^{-7}$ m) of its arrival point and promptly annihilate into 2 gamma rays of equal 511 keV energy emitted 180° apart. If the electron in the medium has a small amount of momentum, $\delta p$, the emission angle of the prompt annihilation is shifted from 180° by an amount equal to $\Theta = \delta p/mc$, where mc is the gamma ray momentum. It is possible to determine the average electron momentum, $\delta p$, by measuring the mean value of $\Theta$ by means of a ring of gamma-ray detectors, similar to that used in the PET cyclotron. Finally, the positrons may capture an electron and form positronium. The positronium may then diffuse randomly up to $10^{-8}$ to $10^{-7}$ meters from its formation point and, if it reaches a surface, may escape to the vacuum where it will live up to $140 \times 10^{-9}$ seconds before it annihilates in to the three gamma rays which are its characteristic signature.

By proper analysis of the annihilation gamma rays emitted from the positrons and positronium in or near the target, it is possible to distinguish the phenomena of prompt annihilation, electron momentum distribution, and positron formation from each other. Prompt annihilation can be measured by placing two gamma ray detectors, such as sodium iodide, at 180° apart and requiring a time coincidence between them to eliminate random background events. The ability to measure the gamma ray energies would further minimize nonrandom background events due to three gamma positronium events which occur isochronously. Positronium formation can be determined by requiring that three gamma ray detectors arranged in a plane centered around the target have a time coincidence between them.

Finally, momentum distributions can be measured by having two arrays of gamma ray detectors place 180° apart, with the arrays having the ability to distinguish the angular deviation of the gamma rays from 180° by values as small as $2 \times 10^{-3}$ radians. Time coincidence and energy measurement requirements similar to those required for detection of prompt annihilation would also be placed on the gamma ray detector arrays.

In accordance with the invention, an image of the distribution of the electron momenta can be built using a gamma-ray microscope or a scanning reflection positron microscope system, thereby achieving an image of the distribution of electron momenta as a function of spatial position. By simultaneously imaging the secondary electrons emitted from the target specimen, or using a scanning positron beam to provide positional correlation with the gamma-rays, a spatial image can be constructed of the electron momentum distribution. Such a spatial image will have direct correspondence with the image of the electron momenta, and thereby the influence of specific changes in target material on the momentum distribution can be studied. Such studies cannot be conducted with electron microscopes. Some examples of the phenomena which can be studied in this manner include changes in the electron momentum distribution, which is equivalent to changes in the Fermi potential energy, at the interfaces within an integrated circuit chip as a function of changes in doping, or changes in energy levels within a biological cell when different materials, such as drugs, are introduced therein. Of course, other types of microscopy using positrons may be possible, such as imaging using positronium emitted from the target specimen.

A positron gamma ray microscope can be built to exploit these signals if a technique for marking the spatial position of the positron prior to its gamma ray annihilation is used. There are at least two such spatial marking techniques which could be used in the practice of the invention, each with its advantages and disadvantages, In both techniques, the ultimate resolution of the microscope is limited by the diffusion of the positron in the bulk from its initial implantation site to a resolution of $10^{-7}$ to $10^{-8}$ meters.

The first technique is called "scanning." In this method, a small positron beams is swept horizontally and vertically across the target in a precisely controlled way by a set of deflection plates. The settings of the deflection plate controls determine the beam position at any instant, giving the spatial marker required for microscopy. The resolution of the scanning microscope is determined by the beam size, if it is larger than the positron diffusion length. Because of the low current densities presently available with slow positron beams, it is difficult to achieve the necessary beam sizes, while still maintaining adequate intensity without resorting to special techniques, such as brightness enhancement. It is with the brightness enhancement technique that the recently developed positron scanning microprobe was able to achieve resolution on the order of $2 \times 10^{-5}$ meters using the gamma coincidence techniques to image positronium formation within a sample.

A second technique for marking the position of the implantation of the positron involves exploiting the phenomenon of secondary electron emission. When a high energy positron of approximately 300 volts or greater enters a sample it will liberate a secondary electron prior to its slowing down to thermal energies and prior to its diffusion in the target. The secondary electron emission probability ranges from 50% to 200%, depending upon the composition of the target and initial positron energy. Because the electron is emitted within $10^{-9}$ meters of the position of the implantation of the positron beam, the secondary electron spectrum contains the spatial information of the positron implantation. The spatial information can be extracted by imaging the electrons in a manner substantially similar to that used in the positron re-emission microscope discussed herein, with opposite voltage polarities (because of the opposite charge of the electron) and somewhat altered geometry.

Because electrostatic or magnetic lenses are used to perform the imaging, the resolution which can be achieved can be predicted by the same equation which describes the transmission positron microscope, but with the current density modified to take into consideration the losses due to gamma ray detector efficiency and secondary electron emission probability. These losses could be as large as 95%. Thus, if a resolution of $10^{-7}$ is desired, a resolution which requires a current density of approximately $10^{-13}$ A/cm$^2$ in the transmission positron microscope, a current density of $2 \times 10^{-12}$ A/cm$^2$ would be required for the gamma ray microscope. Such current densities are available in many existing slow positron beams without the requirement of further brightness enhancement, and this is a primary advantage of the secondary electron technique over the scanning method. For a given resolution, the required positron beam current density is some $10^4$ orders of magnitude lower than the scanning method.

In accordance with a method aspect of the invention, a method of conducting positron microscopy includes the steps of emitting positrons having a first energy level for producing a source stream of positrons and moderating the source stream of positrons for producing a slow positron beam having a second energy level. In accordance with the invention, the second energy level is lower than the first energy level. In addition, the inventive method includes the further steps of propagating the slow positron beam to a specimen target to be imaged and further propagating an image beam which is formed in response to communication between the slow positron beam and the specimen target to an imaging target. A multiplicity of electron clouds are produced in response to communication between the image beam and the imaging target. The electron clouds are then accelerated, illustratively electrostatically, toward a phosphor screen which produces a visible indication.

In one embodiment of the method invention, an image produced in the vicinity of the phosphor screen, responsive to interaction between the accelerated electrons and the phosphor screen, is acquired. The image, which may be acquired by a video system, preferably of the low-light type, is converted into corresponding data which is stored in a memory, and subsequently provided to a computation system. The data is thereby subjected to an analysis algorithm which modifies the stored data, as required, for producing enhancement data corresponding to an enhanced image version of the acquired image.

In one specific illustrative embodiment, the image is formed using ones of the positrons from the slow positron beam which are transmitted through the specimen target. In a scanning version of the subject, positron microscope system, the slow positron beam is scanned, or rastered, across the specimen target, and a signal is recorded as a function of beam position.

In a further illustrative embodiment, the image is formed using ones of the positrons which are reflected from the specimen target In a manner similar to that described hereinabove, the image can be formed by scanning the slow positron beam along the specimen target, the image beam having a characteristic responsive to features in the specimen target at locations thereof corresponding to locations of the slow positron beam during the scanning.

In a still further embodiment of the invention, the information which is generated corresponds to an angular correlation image which is responsive to the angular shift or gamma rays produced during positron annihilation. The image illustrates electron momenta distribution in the specimen target. Moreover, the angular correlation image, in some embodiments, is generated so as to be correlated with an image formed in response to the image beam. Thus, multiple features and characteristics of the specimen target can be imaged in a correlated manner. In a highly advantageous embodiment, the steps of forming the angular correlation image and generating the image responsive to the image beam are performed in response to the further step or scanning the slow positron beam along the specimen target.

BRIEF DESCRIPTION OF THE DRAWING

Comprehension of the invention is facilitated by reading the following detailed description in conjunction with the annexed drawing, in which:

FIG. 7 is a function block and line representation of the momentum distribution analysis electronics.

DETAILED DESCRIPTION

Figure 1:
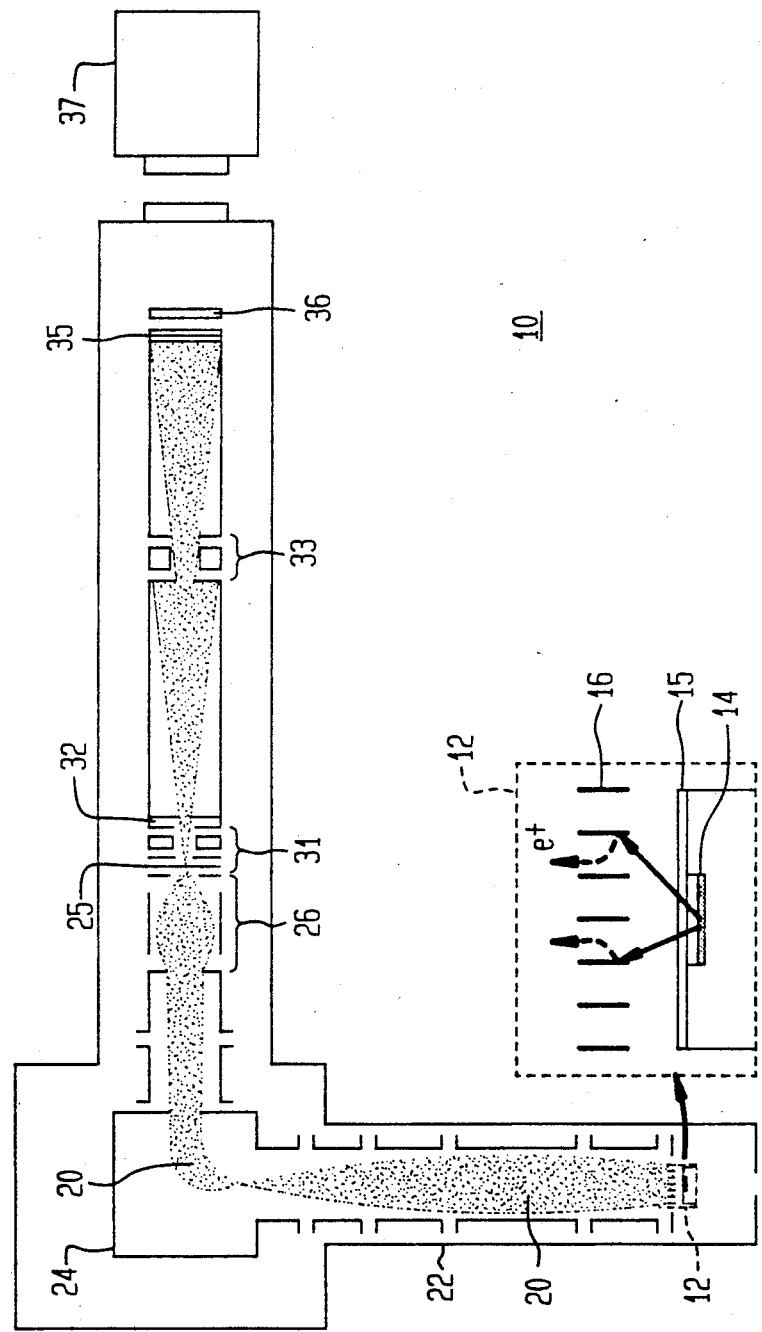
FIG. 1 is a schematic representation of a transmission positron microscope system, constructed in accordance with the principles of the invention.

FIG. 1 is a schematic representation of a transmission positron microscope system 10 constructed in accordance with the principles of the invention. Positrons are obtained from a moderator system 12 which is illustrated in detail in the figure. More specifically, moderator system 12 is provided with a positron source 14 formed of $^{22}$Na. In this specific illustrative embodiment, the $^{22}$Na source is 5 mm in diameter with a radioactivity of 40 mCi. The positrons which are emitted by positron source 14 have an energy illustratively between 100 and 500 keV. Positron source 14 is installed on a titanium (Ti) window 15 which prevents the passage of air therethrough, but permits passage of positrons into the positron microscope system. The positrons which enter the positron microscope system are incident upon a set of Tungsten (W) vanes 16 which are annealed at 2500° C. After losses resulting from source self-absorption, approximately $4 \times 10^{-4}$ of the source positrons are re-emitted at about 2 volts.

The incidence of high energy positrons from positron source 14 onto tungsten vanes 16 causes the positrons to thermalize in tungsten vanes 16, resulting in the slow positrons being emitted. Such slow positrons are emitted with probability of approximately $10^{-3}$ into the positron microscope system.

The slow positrons emitted from tungsten vanes 16 form a positron source beam 20 which is propagated within transmission positron microscope system 10. Positron source beam 20, in this embodiment, has a rate which consists of approximately $7 \times 10^5$ positrons/sec, and is propagated along a beam path 22 to a bending magnet 24. As can be seen from the drawing, the bending magnet, in this embodiment, redirects positron source beam 20 to propagate in a direction substantially orthogonal to beam path 22, and toward a target 25. However, prior to reaching target 25, positron source beam 20, after being bent, is subjected to a condenser lens 26 which focuses the positron source beam onto the target.

In this specific application of transmission positron microscope system 10, target 25 is a polyvinyl chloride acetate co-polymer (V.Y.N.S.) foil. This foil has a thickness which is less than 800 Å, the foil being selected for this purpose in view of the ease with which it can be fabricated in films thin enough for the present application.

In this transmission embodiment of the invention, ones of the positrons which are transmitted through target form a target beam 30 which contains the imaging information. The target beam is propagated through an objective lens 31, a contrast aperture 32, and a projector lens 33, and imaged on a Channel Electron Multiplier Array (CEMA) 35 having three plates and a phosphor 36, which in this embodiment, has a long persistence P39 phosphor.

The combination of Channel Electron Multiplier Array 35 and phosphor 36 converts each of the positrons into a spot of light having approximately $2 \times 10^{-2}$ cm in diameter. This spot of light (not shown) is detected by an image analysis system 37, which is formed of a combination of a video camera, preferably of the low light type, and an image processor. In operation, image analysis system 37 stores data corresponding to the event in an appropriate location of a memory (not specifically shown), which in one embodiment may be in the form of a $384 \times 384$ array. The image processing which occurs in image analysis system 37 results in a signal averaging which allows an image to be built up from the signal events registered by Channel Electron Multiplier Array 35. This may occur at rates as low as 200 Hz, which is a factor of $10^4$ lower than the lowest intensities typically used in electron microscopy.

Figure 2:
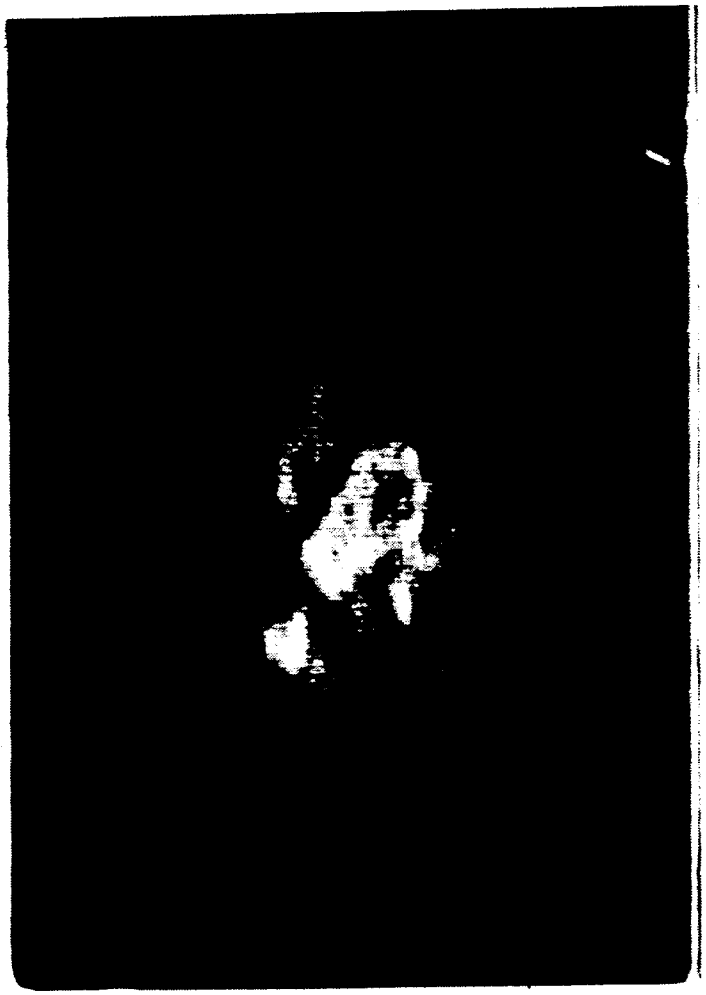
FIG. 2 is an image acquired using the positron microscope system of FIG. 1.

FIG. 2 is a representation of an image acquired using transmission positron microscope system 10, described hereinabove. As previously indicated, target 25 is a V.Y.N.S. film, having a thickness which is estimated not to be less than 800 Å, as determined using optical interferometry techniques. Target 25 was supported during the imaging process on a 100 line, 82% transmitting wire mesh. At these thicknesses, 20-50% of the incident beam was transmitted. The image shown in this figure represents magnification of $55 \times$, and required 4 hours of signal averaging to accumulate. Magnification was calibrated from the known 250 μm grid wire spacing.

Figure 3:
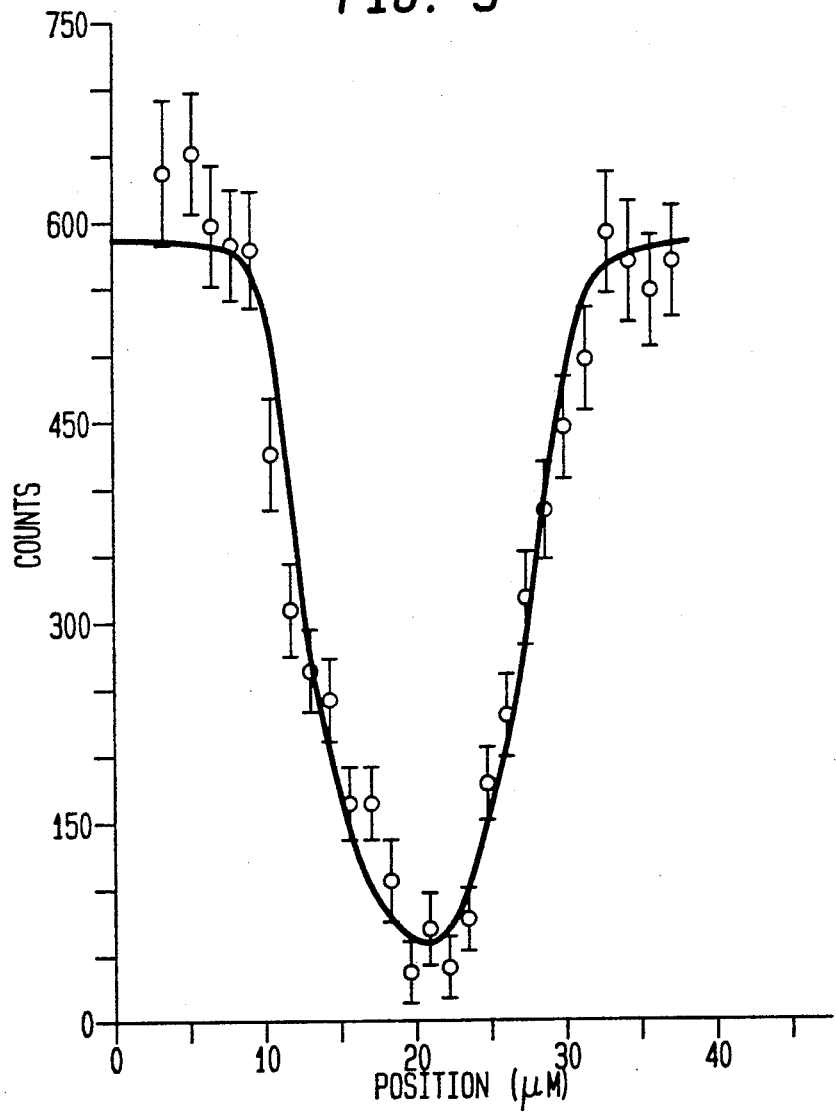
FIG. 3 is a histogram of an image of a grid wire of FIG. 2, using a least squares fit of a Gaussian function.

FIG. 3 is a histogram of one of the grid wires image in FIG. 2, corresponding to a least squares fit of a Gaussian function to the data shown in this figure, which was accumulated during imaging. The zero number of the counts was adjusted to display the entire grid wire profile, and the edges of the wire were fit to a Gaussian function, thereby giving a measured resolution in agreement with the theory.

Figure 4:
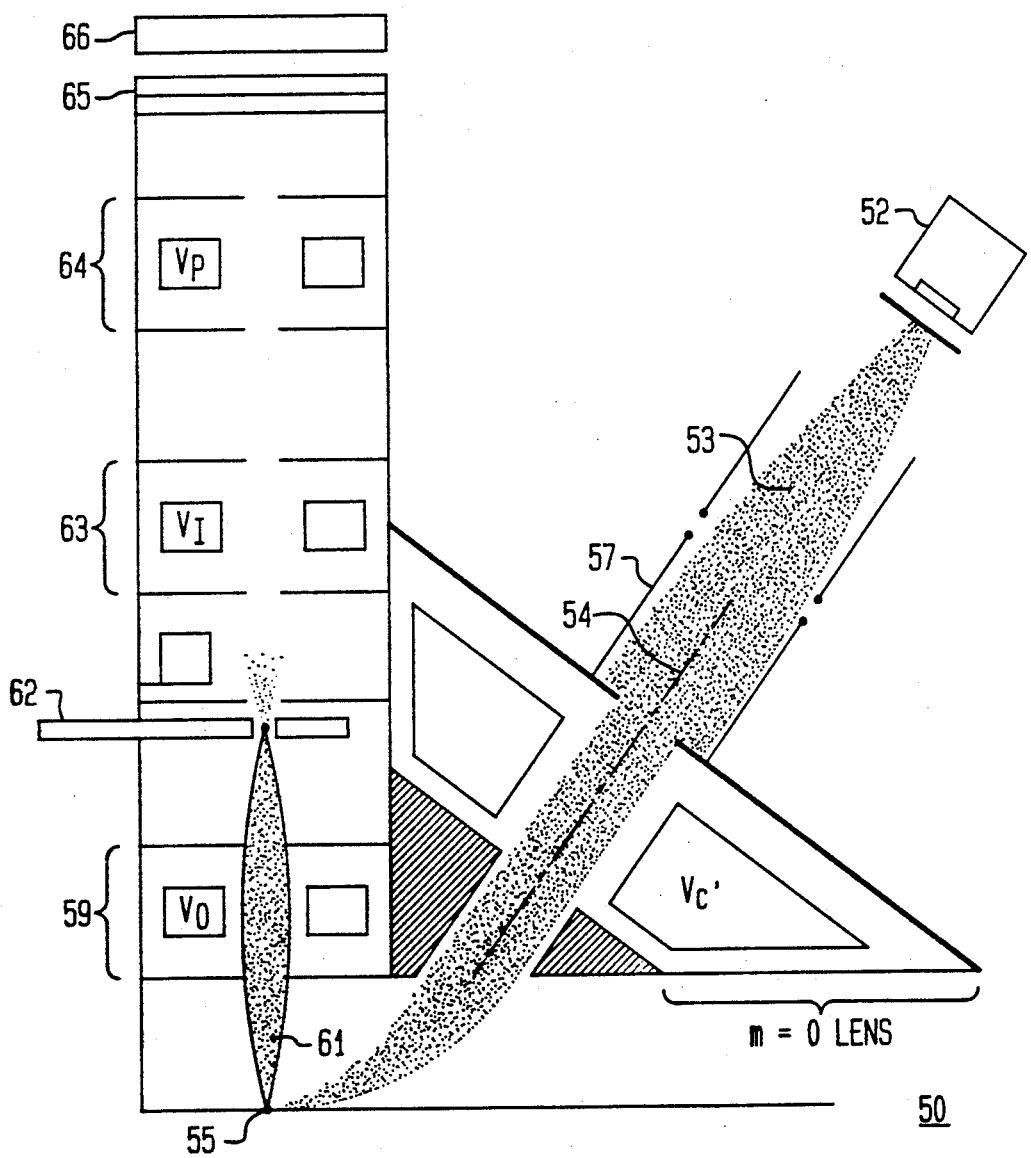
FIG. 4 is a schematic representation of a reflection-style positron re-emission microscope system which employs the principles of the invention.

FIG. 4 is a schematic representation of a reflection-style positron re-emission microscope system 50 constructed in accordance with the principles of the invention. As shown in the drawing, re-emission positron microscope system 50 is provided with a positron moderator 52 which, in this embodiment, provides a slow positron source beam 53 in a manner similar to moderator system 12 described hereinabove with respect to FIG. 1. Slow positron source beam 53 is a substantially parallel incident beam which propagates along a source beam axis 54 generally toward a target 55. The source beam axis, however, is straight only during propagation of slow positron source beam 53 within a beam path 57. Once slow positron source beam 53 approaches the vicinity of target 55, the axis of propagation bends in response to an accelerating electric field which is present between target 55 and an objective lens 59.

Figure 5:
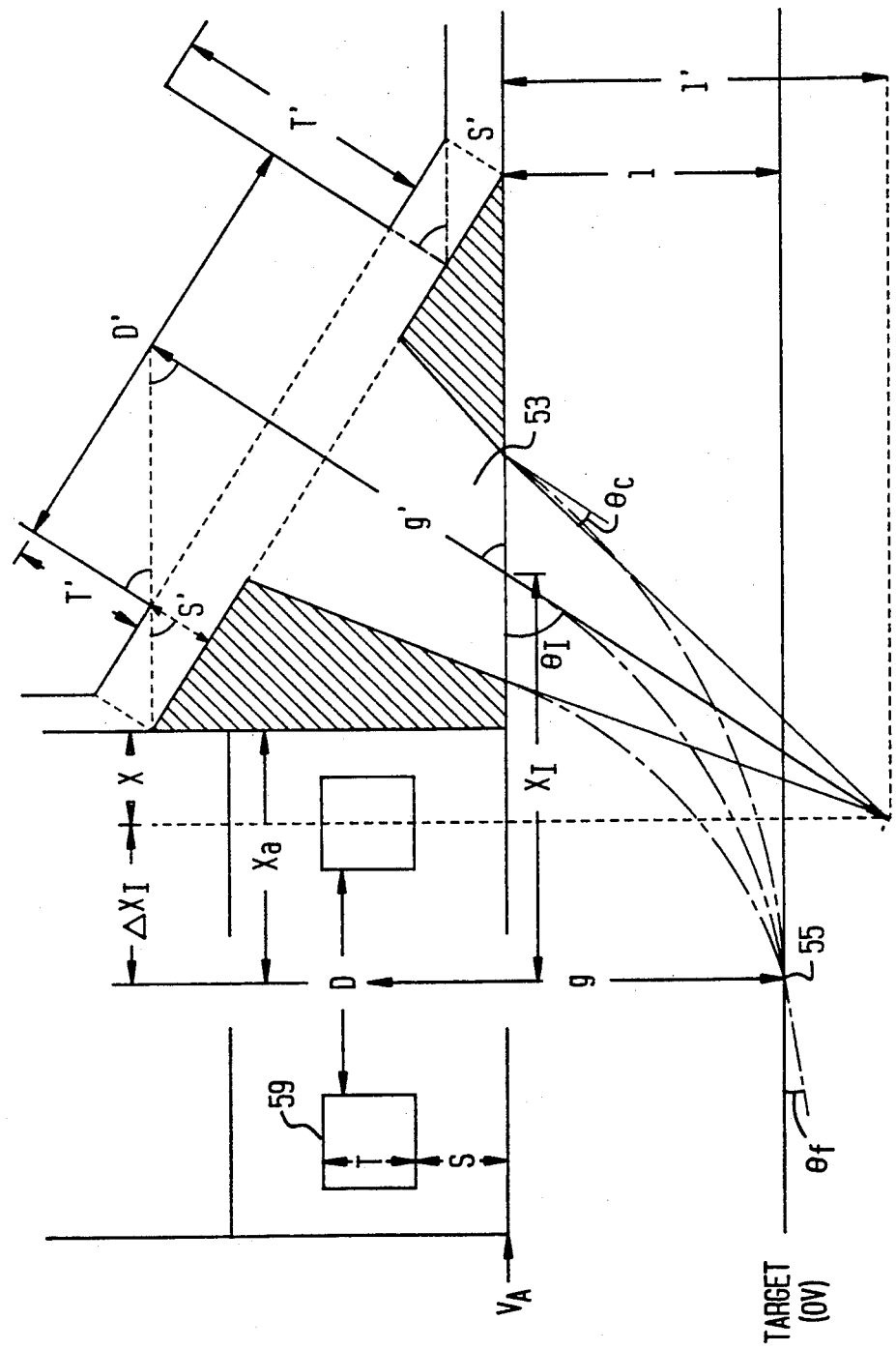
FIG. 5 is a schematic representation of the reflection-style positron re-emission microscope, illustrating the bending of the slow positron source beam as it passes through the electric field between target and the objective lens.

FIG. 5 is a schematic representation illustrating the bending of slow positron source beam 53 as it approaches the electric field between target 55 and objective lens 59. The result is to produce an effective reduction in the focal length from 1' to 1 of an m=0 lens 60. In addition, the angle of incidence of the slow positron source beam with the target is shown in this figure to be changed from $\Theta_I$ to $\Theta_f$. Thus, the electric field has a significant effect on the focal position, and appears to cause the particles in slow positron source beam 53 to follow a parabolic path as they approach the target.

Referring once again to FIG. 4, a positron target beam 61, which is formed of positrons which thermalize in the target and are re-emitted from target 55 as a result of the incidence thereon of slow positron source beam 53, is accelerated by the electric field and then propagated past objective lens 59, a contrast aperture 62, an intermediate lens 63, and projector lens 64 to a channel electron multiplier array 65 which produces an indication on a phosphor screen 66. Of course, a video and processing system, which could be similar to image analysis system 37 described with respect to FIG. 1, could also be employed to acquire and analyze an image.

Figure 6:
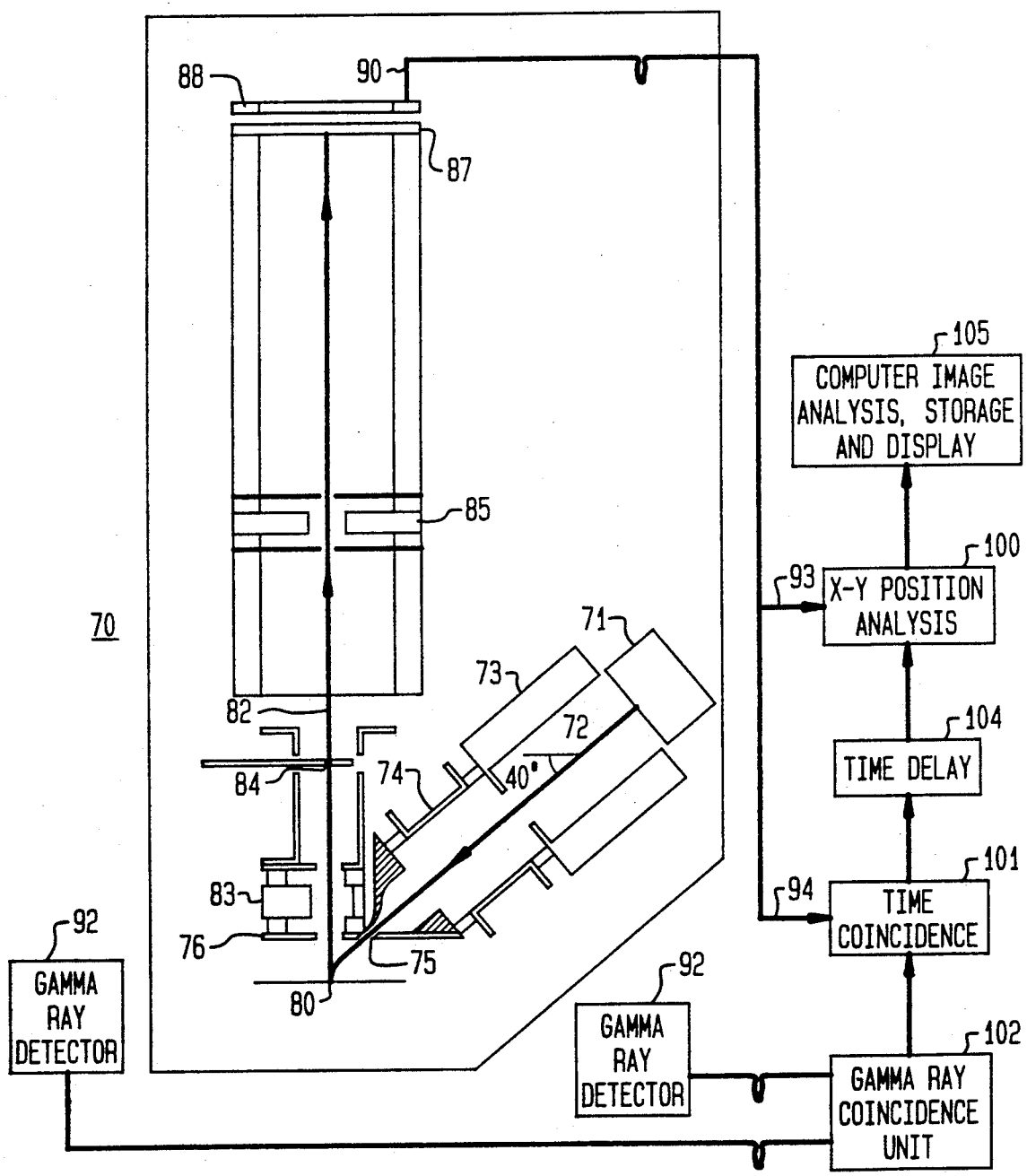
FIG. 6 is a schematic representation of a positron gamma ray microscope useful in the production of spatial images of dual gamma ray coincidences (prompt annihilations), triple gamma ray coincidences (Positronium formation), and momentum distribution (dual gamma ray coincidences with further angular analysis)

FIG. 6 is a schematic representation of a positron gamma ray microscope 70 useful in the production of spatial images of dual gamma ray coincidences (prompt annihilations), triple gamma ray coincidences (Positronium formation), and momentum distribution (dual gamma ray coincidences with further angular analysis). As shown, positron gamma ray microscope 70 is provided with a slow positron generation, focusing, and transport system 71 which produces a substantially parallel beam 72. This beam is propagated through an input lens 73 and is focused by a condenser lens 74 so as to be passed through a deflection block aperture 75 into an acceleration and deflection block 76. While beam 72 is within acceleration and deflection block 76, it is deflected, illustratively by an electric field, so as to follow a concave, downward parabolic path to a target 80. The geometry of acceleration and deflection block 76, and the electric field between this block and target 80, is such that the beam is substantially in focus when it arrives at target 80.

The secondary electrons which are emitted by the positron beam as it impacts target 80 are accelerated as a secondary electron beam 82 by acceleration and deflection block 76. The secondary electron beam 82 is propagated to, and focused by, an objective lens 83. The focused electrons of secondary electron beam 82 pass through a contrast aperture 84 which serves to limit the angular spread of secondary electron beam 82, thereby improving the resolution. The secondary electron beam continues its propagation until a magnified image is formed just prior to a projector lens 85. The projector lens focuses and further magnifies the image until a final magnified image is formed at a channel electron multiplier array (CEMA) 87. The channel electron multiplier array generates a multiplicity of electrons for each incident electron, localized in a small spot, which are then incident upon a resistive anode encoder (RAE) 88.

The resistive anode encoder is one of several devices which can generate signals suitable for simultaneous position analysis and timing information. These signals, which may be in the form of x,y readout signals, are conducted within the vacuum of positron gamma ramicroscope 70 via a signal conductor 90. Once removed from the positron gamma ray microscope, the x,y readout signals are split into signals suitable for position analysis and timing information, as will be described hereinbelow.

Referring for the moment to positrons which impact target 80, these annihilate into gamma rays which are detected by gamma ray detectors 92. These gamma radetectors may number either two, as shown in the Figure, for detecting annihilation, or three, for detecting formation of positronium. In embodiments wherein there are three such gamma ray detectors provided, they are arranged to be substantially coplanar with respect to one another. As will be described hereinbelow with respect to FIG. 7, each such gamma ray detector may be an array of gamma ray detectors, particularly if momentum analysis is desired to be performed.

In FIG. 6, the x,y readout signals are split into position signals 93, suitable for position analysis and timing signals 94 which provide timing information. Position signals 93 are conducted to an x,y position analysis system 100, and timing signals 94 are conducted to a time coincidence unit 101. The signals generated by gamma ray detectors 92 are conducted to a gamma ray coincidence unit 102 where spatial coincidence and energy requirements are determined using commercially available electronics. In this embodiment, the output of gamma ray coincidence unit 102 is conducted to an input of time coincidence unit 101, where a time coincidence with timing signals 94 from resistive anode, encoder 88 is determined to exist. In the event of a coincidence, a signal from time coincidence unit 101 is delivered to a time delay 104, to adjust the position in time relative to the processing speed of x,y position analysis system 100, which has been analyzing position signals 93 in a manner substantially coincident in time with gamma ray coincidence unit 102. The signal from time delay 104 is delivered to the time gate (not shown) of x,y position analysis system 100, so as to release the event to a computer image processing memory and display 105 where it is stored.

FIG. 7 is a function block and line representation of a specific illustrative embodiment of a momentum distribution analysis electronic system 120. As shown, momentum distribution analysis electronic system 120 operates when a positron 121 annihilates with an electron to yield gamma ray 123 and gamma ray 124, as a pair of simultaneously issued gamma rays. Each gamma ray has an energy of approximately 511 keV, but shifted by a small angle from 180° by the electron momentum. The gamma rays are incident upon respectively associated ones of a pair, in this embodiment, of arrays of gamma ray detectors 125 and 126. Thus, gamma ray detector array 125 reacts to gamma ray 123 separately from gamma ray detector array 126 which reacts to gamma ray 124. As shown, each gamma ray detector array is formed of a plurality of individual detectors having a predetermined positional relationship with respect to one another. In this specific embodiment, each gamma ray detector array is shown to have six individual detectors therein.

Gamma ray detector arrays 125 and 126 are each coupled to deliver their signals to detector systems 130 and 131, respectively. These detector systems determine which one of the individual detectors within the detector arrays detected the gamma rays, and also the energy of the gamma rays.

If the energy is satisfactory, timing signals from detector system 130 and detector system 131 are conducted to a time coincidence unit 132, where a timing signal from a resistive anode encoder (not shown in this figure) is waiting via a timing signal line 133. In the meantime, signals from detector system 130 and detector system 131 corresponding to the numbers of the detectors within the arrays which detected the gamma rays are conducted an angular determination unit 140 which utilizes the predetermined relative detector positions to determine the angular deviation.

If a triple time coincidence occurs, time coincidence unit 132 sends a signal to a gate input 141, and the angular determination from angular determination unit 140 is released to an x,y memory map unit 143. An x,y position for the angular determination is calculated from the x,y signals from the resistive anode encoder by an x,y determination unit 145 which conducts the x,y position signals to x,y memory map unit 143, essentially at the same time that it receives the angular determination. When sufficient data has been accumulated, a momentum algorithm 146 determines the electron momentum from the angular information in x,y memory map unit 143, and stores the resulting values in an x,y momentum memory map 147, which causes a responsive display to be produced on a video monitor 148.

Although the invention has been described in terms of specific embodiments and applications, persons skilled in the art can, in light of this teaching, generate additional embodiments without exceeding the scope or departing from the spirit of the claimed invention. Accordingly, it is to be understood that the drawing and description in this disclosure are proffered to facilitate comprehension of the invention, and should not be construed to limit the scope thereof.

What is claimed is:

1. A positron microscope system for producing magnified images of a specimen target, the positron microscope system comprising:
   slow positron source means for producing a source beam formed of low energy positrons;
   focusing means for focusing said source beam and directing said low energy positrons of said source beam onto the specimen target;
   single particle image enhancement means for producing an image responsive to a target beam formed of particles emitted from the specimen target, said single particle image enhancement means being characterized by;
   target plate means having a region having first and second dimensions for receiving the incident particle, said target plate means emitting a multiplicity of electrons in response to the incident particle; and
   resistive anode encoder means arranged to receive at least one of said multiplicity of electrons from said target plate means, for providing a location signal responsive to the location of impingement of said incident particle in said region of said target plate means, and a timing signal responsive to a timing of said impingement of said incident particle in said region of said target plate means;
   gamma ray detector means for detecting gamma rays which issue from the specimen target and producing a gamma ray detector signal responsive to said detection of said gamma rays; and
   timing coincidence means for producing a signal responsive to a timing coincidence between said timing signal and said gamma ray detector signal.

2. The positron microscope system of claim 1 wherein said slow positron source means comprises positron moderator means for producing low energy positrons.

3. The positron microscope system of claim 2 wherein said positron moderator means comprises thermalizing means for receiving high energy positrons and producing responsively said source beam.

4. The positron microscope system of claim 3 wherein said thermalizing means is formed of W, and said positron moderator means further comprises:
   high energy positron source means for providing high energy positrons; and
   window means arranged intermediate of said source means and said thermalizing means, for supporting said source means in the vicinity of said thermalizing means.

5. The positron microscope system of claim 4 wherein said source means is formed of $^{22}$Na and said window means is formed of Ti, whereby high energy positrons emitted by said high energy positron source means propagate through said window means and communicate with said thermalizing means.

6. The positron microscope system of claim 4 wherein said thermalizing means is configured as a plurality of vanes.

7. The positron microscope system of claim 1 wherein there is further provided source beam bending means for bending said source beam.

8. The positron microscope system of claim 1 wherein said single particle image enhancement means is arranged to receive ones of said particles which are emitted from the specimen target in a direction substantially toward said slow positron source means.

9. A positron microscope system for producing magnified images of a specimen target, the positron microscope system comprising:
   slow positron source means for producing a source beam of positrons formed of low energy positrons;
   first focusing means for focusing said source beam of positrons and directing said low energy positrons of said source beam onto the specimen target;
   second focusing means for focusing a beam of secondary electrons formed of secondary electrons produced in response to incidence of said source beam of positrons in the specimen target; and
   imaging means responsive to said beam of secondary electrons for producing an image signal, said imaging means being provided with;
   a single particle image enhancement arrangement in the form of a channel electron multiplier array for producing a multiplicity of responsive electrons for each of said secondary electrons impinging thereon;
   position detector means for receiving said responsive electrons from said channel electron multiplier array and producing position signals responsive to a location of said secondary electrons;

timing means for producing a timing signal responsive to communication of said secondary electrons with said imaging means, and a timing signal responsive to a timing of said impingement of said incident particle in said region of said target plate means;

gamma ray detector means for detecting gamma rays which issue from the specimen target and producing a gamma ray detector signal responsive to said detection of said gamma rays; and timing coincidence means for producing a signal responsive to a timing coincidence between said timing signal and said gamma ray detector signal.

10. The positron microscope system of claim 9 wherein said imaging means comprises a single particle image enhancement arrangement for producing a substantially visible signal responsive to said secondary electrons.

* * * * *